United States Patent [19]
Pille

[11] 3,921,200
[45] Nov. 18, 1975

[54] COMPOSITE BEAM LEAD METALLIZATION

[75] Inventor: Hans J. Pille, Mesa, Ariz.

[73] Assignee: Motorola, Inc., Chicago, Ill.

[22] Filed: Apr. 15, 1974

[21] Appl. No.: 461,079

[52] U.S. Cl. .................... 357/67; 357/68; 117/212; 156/11

[51] Int. Cl.[2] .................... H01L 23/48; H01L 29/46; H01L 29/62; H01L 29/64

[58] Field of Search ......... 156/11; 117/212; 357/67, 357/68

[56] References Cited

UNITED STATES PATENTS

| | | | |
|---|---|---|---|
| 3,567,508 | 3/1971 | Cox et al. | 357/67 |
| 3,654,526 | 4/1972 | Cunningham et al. | 357/67 |
| 3,716,469 | 2/1973 | Bhatt et al. | 357/67 |

*Primary Examiner*—Andrew J. James
*Attorney, Agent, or Firm*—Harry M. Weiss; Willis E. Higgins

[57] ABSTRACT

A gold compatible metallization system is described which uses an alloy of alluminum, platinum and gold. This alloy can be used for the contact pad on the semiconductor die as well as for the via connector used in connecting one metal layer to a second metal layer. This metallization system comprises a gold wire from the terminal post on the package to the contact pad on the semiconductor die. The contact pad is an alloy of aluminum, platinum and gold. Depending on whether the metallization run is second layer metal or first layer metal the metallization runs can be essentially pure aluminum or silicon aluminum, respectively. The via connector is used in connecting the first layer metal to the second layer metal. A method for forming the alloy portion of the metallization run includes that of forming the alloy during the sputter etching of the platinum layer from the undesired parts of the semiconductor body.

3 Claims, 5 Drawing Figures

COMPOSITE BEAM LEAD METALLIZATION

BACKGROUND OF THE INVENTION

The prior art shows the use of sequential layers of aluminum, platinum and gold as in U.S. Pat. No. 3,689,332. However, the use of these sequential layers is for making the ohmic contact to a diffused region. Because of the activity of the gold in such a three layer system, the gold penetrates the aluminum and platinum layers and even penetrates into the semiconductor body shorting out the junction of the diffused region, rendering the device inoperative. The present invention uses sequential layers of aluminum, platinum and gold to form an alloy. The alloy is compatible with both the use of gold wires for wire bonding and aluminum metal layers on the semiconductor die. The alloy is only formed such as to overlay a passivation layer so that the gold will not penetrate into the semiconductor body. The alloy is also formed far enough away from the preohmic opening such that the gold will not be able to migrate laterally through the aluminum layer into the semiconductor body.

SUMMARY OF THE INVENTION

The present invention relates to a metallization system for use with semiconductor structures and, more particularly, to a metallization system which is gold compatible beginning at the terminal post of the semiconductor package and continuing into the ohmic contact for contacting the diffused region in a semiconductor die.

Another object of the present invention is to provide a metallization system utilizing an alloy of aluminum, platinum and gold for use as a via contact in conjunction with a layer of silicon-aluminum extending between the alloy contact and the diffused region within the semiconductor body.

A still further object of the present invention is to provide a metallization system comprising an alloy of aluminum, platinum and gold for extending through an opening in the passivation layer positioned on a semiconductor surface and for contacting, at one end of the via, a silicon aluminum metallization run and for contacting, at the other end of the via, a second layer of essentially pure aluminum metallization.

Another object of the present invention is to provide an alloy of aluminum, platinum and gold at a point within the metallization system wherein the disruptive characteristics of the resulting alloy are blocked from interfering with the semiconductor body by an intervening passivating layer.

A still further object of the present invention is the use of an alloy of aluminum, platinum and gold within the metallization system and displaced sufficiently from vias in the surface passivation layer of the semiconductor body such that the disruptive characteristics of the alloy are masked from the semiconductor surface.

These and other objects of this invention will become fully apparent in the following description of the drawings.

BRIEF DESCRIPTION OF THE INVENTION

Figures 1, 2, 3, 4, 5:
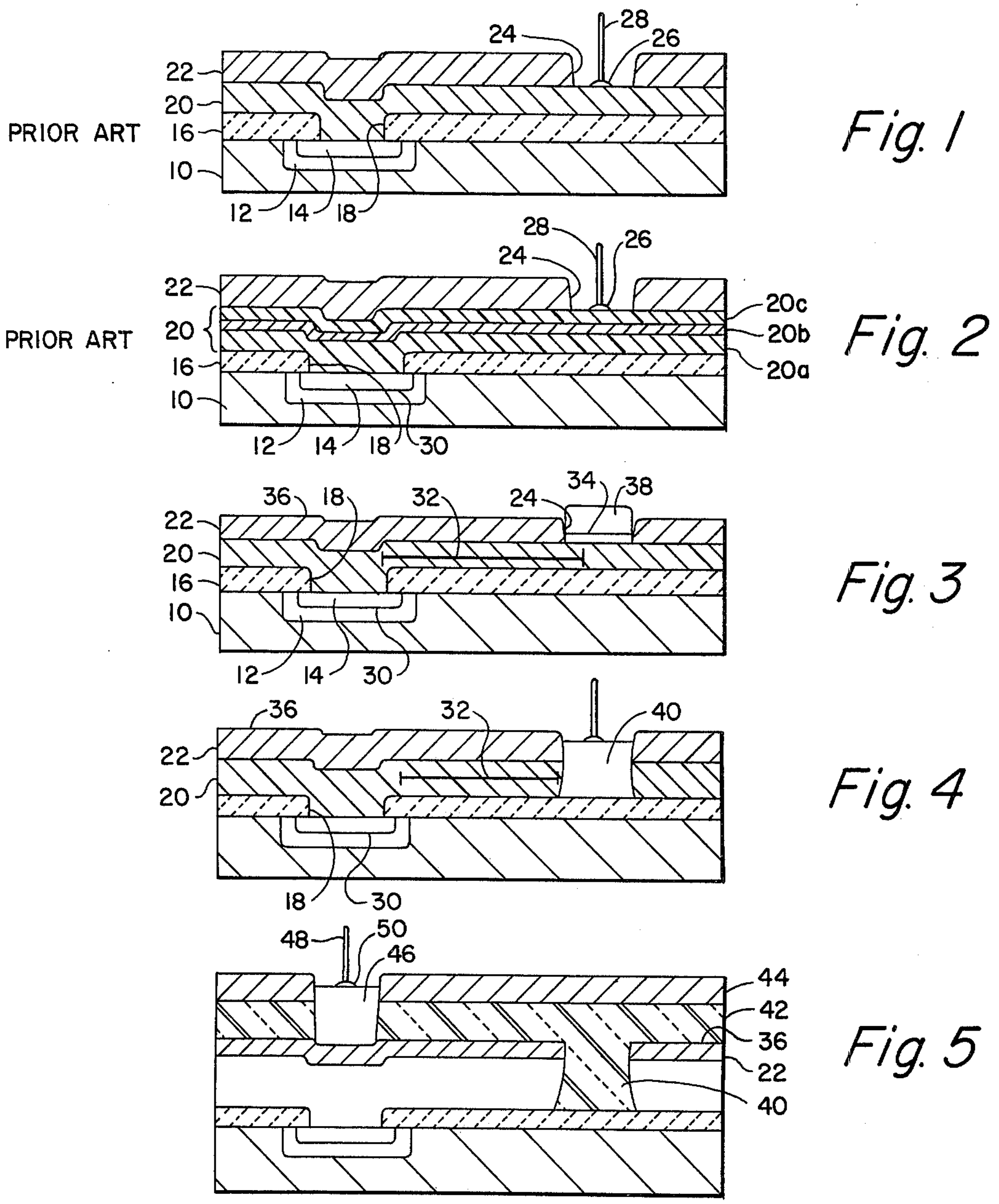
FIG. 1 is a prior art cross-sectional view showing a metallization system using only a first layer metallization of silicon aluminum.
FIG. 2 shows a cross-sectional view of a prior art metallization system using aluminum, platinum and gold as individual layers across the surface of the semiconductor structure.
FIG. 3 is a cross-sectional view of the present invention prior to the alloying of the aluminum, platinum and gold regions.
FIG. 4 shows the cross-sectional view of the present invention showing the alloying of the aluminum, platinum and gold composition using a single layer metallization.
FIG. 5 shows the cross-sectional view of the present invention in use in a double layer metallization system.

The present invention is directed to an alloy of aluminum, platinum and gold for use as the contact pad and/or the via contact in a single or multiple layer metallization systems for semiconductor devices. The contact pad is positioned on the upper surface of the semiconductor die. Wire bonds are made to such contact pads. The via contact is that contact element which extends through a passivation or masking layer on the surface of a semiconductor device. A via contact specifically excludes a contact extending through the surface passivation layer positioned over a multiple surface diffusion wherein the diffusions are of opposite conductivity type, i.e. an emitter diffusion within a base diffusion. The reason for this distinction is that the aluminum, platinum, gold alloy has a disruptive property in that the platinum is driven into the semiconductor body, through the first diffusion and into the second diffusion causing a shorting of the junction, i.e. through the emitter diffusion into the base diffusion such as to create a short between the emitter region and the base region.

The temperature range within which the alloying appears as satisfactory begins at a lower temperature of 425°C and continues through 600°C. In practice, the metallization system for use on shallow junction integrated circuits should be formed within a low temperature range, preferably 425°C to 460°C. When the temperature range exceeds the minimum alloying temperature, the alloying time period is reduced. More specifically, at a minimum temperature such as 425°C, or thereabouts, the alloying period takes a sufficiently longer period of time than it would take if the alloy temperature was 600°C. For shallow junction integrated circuits, the alloy temperature could not be 600°C and hence at a temperature of 600°C the alloy time is significantly shorter. As a general rule, the alloying period is a function of the alloy temperature. Accordingly, since lower temperatures are used for integrated circuits as compared to discrete devices, the alloy period for integrated circuits is necessarily longer than the alloy period with respect to discrete devices.

The usage of the alloy as a via contact is possible because the alloy is compatible with both silicon-aluminum layers and essentially pure aluminum. The use of the alloy as a contact pad is possible because the alloy is compatible to both the gold wire used in the wire bond and the silicon-aluminum layer used as the first metal layer.

The percentages of the aluminum, platinum and gold composition can vary. Applicant has successfully made alloys having the percentages by weight:

Aluminum 0.1 to 0.5
Platinum 0.5 to 1.75
Gold 99.4 to 97.75

However, it was within the skill of the art to determine the full range of percentages which are usable to form the alloy and used in the environment of applicant's invention.

DETAILED DESCRIPTION OF THE INVENTION

Referring to FIG. 1 there can be seen a prior art metallization system which includes a semiconductor body 10 which operates as the collector, a first diffused region 12 operating as the base and a second diffused region 14 operating as an emitter. A surface passivation layer 16 includes an aperture therethrough as defined by the sides 18 of the passivation layer. The aperture exposes the emitter diffusion 14. A metallization layer 20 is formed of either pure aluminum or silicon-aluminum. The layer 20 contacts the emitter region 14 directly or through an intervening platinum silicide enhancement surface layer not shown. A final surface passivation layer 22 is formed with an aperture 24 exposing a portion of the metallization layer 20. A wire bond is shown at 26 attaching the wire 28 to the metallization layer 20. It is not shown but the wire 28 is normally attached to a terminal post which extends from within the semiconductor package to outside the semiconductor package and appears outside the package as one lead of the package.

Throughout the several views the same numeral will be used to identify similar elements in the several views. Referring to FIG. 2 there can be seen a semiconductor body 10 having a first diffused region 12 as the base and a second diffused region 14 as the emitter. A surface passivation layer 16 is formed with an aperture 18 for exposing a portion of the emitter region 14. The metallization layer 20 in FIG. 2 comprises a plurality of individual layers. A first individual layer of aluminum is shown at 20*a*. A second individual layer of platinum is shown at 20*b* and a final individual layer of gold is shown as 20*c*. A surface passivation layer is shown at 22 having an aperture 24 for exposing a surface area of the metallization layer 20. A wire 28 is attached to the layer 20 by a wire bond shown at 26. In the embodiment shown in FIG. 2 when the structure is raised above the alloy temperature of 425°C, which is normally encountered during the packaging of the semiconductor device, the gold layer 20*c* is positioned directly above a diffused region 12 and 14 and as such the gold enters the semiconductor body and shorts out the emitter base junction as shown at 30. Accordingly, the embodiment shown in FIG. 2 causes failures due to junction shorts. In the event that the alloy temperature is not reached in such an embodiment as shown in FIG. 2, then the individual layers remain and the applicant's invention is not reached.

Referring to FIG. 3 there can be seen a schematic view of the first embodiment of applicant's invention. In this embodiment a semiconductor body is shown at 10 having a first diffused region such as a base shown at 12. A second diffused region such as an emitter is shown at 14 having an emitter base junction 30 formed therebetween. A surface passivation layer is shown at 16 having an aperture at 18 for exposing a portion of the emitter region 14. A first metallization layer is formed over the surface of the surface passivation layer 16 and within the aperture 18 for contacting the emitter region 16. This metallization layer 20 can be either pure aluminum or as is commonly used today a silicon-aluminum layer. Methods for enhancing the contact between silicon aluminum layer 20 and the diffused region 14 such as a platinum silicide intermediate element can be used. In addition, any other well known contact enhancement method can be used for enhancing the contact of the silicon aluminum to the diffused region. A surface passivation layer is shown at 22 having an aperture at 24. The aperture at 24 exposes a region of the metallization layer 20 which is conveniently displaced a distance indicated by the line 32 from the first aperture 18. Within the aperture 24 a first layer 34 is formed. This first layer 34 is a platinum layer. As is well known the platinum is formed over the entire upper surface 36 of the surface passivation layer 22. Thereafter a gold layer 38 is formed over and coextensive with the platinum layer. During the sputter etching of the platinum layer and the removal of the gold layer, the temperature of the substrate including the aluminum, platinum gold components thereof extends above the alloy temperature of 425°C. In this event an alloy is formed as shown in the solid region 40 of FIG. 4. In the event that the sputter etching is carried out with a water cooled sputter etcher the temperature may not exceed 425°C. Thereafter a separate alloying step should be carried out so that the aluminum 20, platinum 24 and gold layers 38 are alloyed and form a substantially continuous member as illustrated in the FIG. 40.

Referring again to FIGS. 3 and 4 it should be noted that the alloy 40 provides the principle function of a via contact. The via contact refers to the fact that the alloy region 40 extends from the upper side 36 of the passivating layer 22 to the internal metallization layer 20. More specifically, a via performs the function of forming a contact through a passivation layer. It should also be noted that the via contact 40 is displaced a distance 32 from the aperture 18 such that the gold from the layer 38 will not penetrate the longitudinal distance 32 of the aluminum and enter through the aperture 18 into the semiconductor body so as to short out the junction 30.

In FIG. 5 there is shown the addition of a second metallization layer 42 formed over the surface 36 of the first passivation layer 22. The second metallization layer 42 also contacts the via contact 40. Thereafter, as is not shown in FIG. 5 but is shown in FIG. 3, a platinum and gold layer are formed on the surface of a second passivation layer 44. As described with reference to FIG. 3 the platinum and gold are removed and either during the removal operation a second via is formed at 46 or during an independent alloying step. Thereafter a gold wire 48 is attached by a wire bond 50 to the second via 46 and is connected to a post which again extends outside of the semiconductor package.

While the invention has been particularly shown and described in reference to the preferred embodiments thereof, it will be understood by those skilled in the art that changes in form and details may be made therein without departing from the spirit and scope of the invention.

What is claimed is:

1. A contact pad for a semiconductor die comprising:

an alloy of aluminum, platinum and gold wherein the percentages of each is given in percentages by weight of the alloy, said gold lying within the range of 99.4 to 97.75 percent, said platinum lying within the range of 0.5 to 1.75 percent, and said aluminum lying within the range of 0.1 to 0.5 percent.

2. A metallization system for use on a semiconductor device including a semiconductor body having a pair of diffused regions the upper one of which is located wholly within the lower one and including a surface passivation layer having an aperture formed therein and exposing a portion of the upper diffused region and a first layer of metallization in contact with the first diffused region and positioned over the surface passivation layer, the improvement comprising:

a second passivation layer formed over the first metallization layer; a via contact extending through the second passivation layer comprising additional layers of platinum and gold alloyed to the first metallization layer.

3. A semiconductor device of the type including a semiconductor substrate having a junction contained therewithin and a surface passivation layer formed on the surface of said substrate and having an aperture exposing a portion of said substrate positioned over the junction and a surface metallization layer formed over said passivation layer and positioned within said aperture and contacting the surface of said semiconductor chip above the junction, the improvement comprising:

a second passivation layer positioned above said first metallization layer and containing an aperture for exposing a portion of said first metallization layer; and a via contact through said second passivation layer comprising a layer of platinum and gold alloyed with the first metallization layer for forming an alloy of aluminum, platinum and gold.

* * * * *